(12) United States Patent
Oyamada et al.

(10) Patent No.: US 10,381,320 B2
(45) Date of Patent: Aug. 13, 2019

(54) SILVER BONDING WIRE FOR SEMICONDUCTOR DEVICE CONTAINING INDIUM, GALLIUM, AND/OR CADMIUM

(71) Applicants: NIPPON STEEL CHEMICAL & MATERIAL CO., LTD., Tokyo (JP); NIPPON MICROMETAL CORPORATION, Iruma-shi, Saitama (JP)

(72) Inventors: Tetsuya Oyamada, Tokyo (JP); Tomohiro Uno, Tokyo (JP); Hiroyuki Deai, Tokyo (JP); Daizo Oda, Saitama (JP)

(73) Assignees: NIPPON STEEL CHEMICAL & MATERIAL CO., LTD., Tokyo (JP); NIPPON MICROMETAL CORPORATION, Saitama (JP)

( * ) Notice: Subject to any disclaimer, the term of this patent is extended or adjusted under 35 U.S.C. 154(b) by 0 days.

(21) Appl. No.: 14/915,189

(22) PCT Filed: May 20, 2015

(86) PCT No.: PCT/JP2015/064417
§ 371 (c)(1),
(2) Date: Feb. 26, 2016

(87) PCT Pub. No.: WO2016/006326
PCT Pub. Date: Jan. 14, 2016

(65) Prior Publication Data
US 2017/0110430 A1    Apr. 20, 2017

(30) Foreign Application Priority Data
Jul. 10, 2014    (JP) ................ 2014-142127

(51) Int. Cl.
*H01L 23/00* (2006.01)
*C22C 5/10* (2006.01)

(52) U.S. Cl.
CPC .............. *H01L 24/45* (2013.01); *C22C 5/10* (2013.01); *H01L 24/43* (2013.01); *H01L 24/05* (2013.01); *H01L 24/48* (2013.01); *H01L 24/85* (2013.01); *H01L 2224/05624* (2013.01); *H01L 2224/4321* (2013.01); *H01L 2224/43848* (2013.01); *H01L 2224/43986* (2013.01); *H01L 2224/45015* (2013.01); *H01L 2224/45101* (2013.01); *H01L 2224/45105* (2013.01); *H01L 2224/45109* (2013.01); *H01L 2224/45117* (2013.01); *H01L 2224/45138* (2013.01); *H01L 2224/45139* (2013.01); *H01L 2224/45144* (2013.01); *H01L 2224/45147* (2013.01); *H01L 2224/45155* (2013.01); *H01L 2224/45163* (2013.01); *H01L 2224/45164* (2013.01); *H01L 2224/45169* (2013.01); *H01L 2224/45173* (2013.01); *H01L 2224/48247* (2013.01); *H01L 2224/48463* (2013.01); *H01L 2224/48479* (2013.01); *H01L 2224/48507* (2013.01); *H01L 2224/85065* (2013.01); *H01L 2224/85075* (2013.01); *H01L 2224/85439* (2013.01); *H01L 2924/00011* (2013.01); *H01L 2924/00014* (2013.01); *H01L 2924/10253* (2013.01); *H01L 2924/181* (2013.01)

(58) Field of Classification Search
CPC .... B21C 1/00; C22C 1/02; C22C 5/06; H01B 1/02; H01B 5/02; H01L 23/48; H01L 2224/45144; H01L 2924/00014
See application file for complete search history.

(56) References Cited

U.S. PATENT DOCUMENTS

| | | | | |
|---|---|---|---|---|
| 2007/0228534 A1* | 10/2007 | Uno | ............... | H01L 23/49524 257/678 |
| 2008/0240975 A1* | 10/2008 | Cho | ............... | C22C 5/06 420/503 |
| 2009/0072399 A1* | 3/2009 | Terashima | ............... | H01L 24/43 257/741 |
| 2011/0011619 A1* | 1/2011 | Uno | ............... | B23K 35/0222 174/126.2 |
| 2012/0263624 A1 | 10/2012 | Chiba et al. | | |
| 2014/0209215 A1* | 7/2014 | Chuang | ............... | H01L 24/45 148/518 |

FOREIGN PATENT DOCUMENTS

| | | |
|---|---|---|
| CN | 1073292 A | 6/1993 |
| CN | 102130069 A | 7/2011 |
| CN | 102312120 A | 1/2012 |
| CN | 103614588 A | 3/2014 |
| EP | 2703116 A1 | 3/2014 |

(Continued)

OTHER PUBLICATIONS

International Search Report issued in related International Application No. PCT/JP2015/064417, dated Aug. 4, 2015.
Office Action issued in corresponding Chinese Application No. 201580001736.3, dated Sep. 14, 2016.
English translation of Written Opinion Singapore Patent Application No. 11201601519Y dated May 30, 2016.
Extended European Search Report issued in corresponding European Patent Application No. 15819755.8, dated Jul. 7, 2017.
Partial Supplementary European Search Report issued in corresponding EP Application No. 15819755.8, dated Jan. 10, 2017.

*Primary Examiner* — Dale E Page
*Assistant Examiner* — Wilner Jean Baptiste
(74) *Attorney, Agent, or Firm* — McDermott Will & Emery LLP

(57) ABSTRACT

The present invention provides a bonding wire which can satisfy bonding reliability, spring performance, and chip damage performance required in high-density packaging. A bonding wire contains one or more of In, Ga, and Cd for a total of 0.05 to 5 at %, and a balance being made up of Ag and incidental impurities.

18 Claims, No Drawings

(56) References Cited

FOREIGN PATENT DOCUMENTS

| | | | |
|---|---|---|---|
| GB | 2248416 | A | 4/1992 |
| JP | S60-204844 | A | 10/1985 |
| JP | H01-110141 | A | 4/1989 |
| JP | H01162343 | A | 6/1989 |
| JP | H11-288962 | A | 10/1999 |
| JP | 2001-176912 | A | 6/2001 |
| JP | 2002-319597 | A | 10/2002 |
| JP | 2005-054268 | A | 3/2005 |
| JP | 2008-198977 | A | 8/2008 |
| JP | 2009-033127 | A | 2/2009 |
| JP | 2009-140942 | A | 6/2009 |
| JP | 2012-169374 | A | 9/2012 |
| KR | 101416778 | B1 | 7/2014 |

\* cited by examiner

US 10,381,320 B2

SILVER BONDING WIRE FOR SEMICONDUCTOR DEVICE CONTAINING INDIUM, GALLIUM, AND/OR CADMIUM

CROSS REFERENCE

This application is the U.S. National Phase under 35 U.S.C. § 371 of International Application No. PCT/JP2015/064417, filed on May 20, 2015, which claims the benefit of Japanese Application No. 2014-142127, filed on Jul. 10, 2014, the entire contents of each are hereby incorporated by reference.

TECHNICAL FIELD

The present invention relates to a bonding wire for a semiconductor device used to connect electrodes on semiconductor elements with wiring such as external leads of a circuit wiring board.

BACKGROUND ART

Currently, as bonding wires for a semiconductor device (hereinafter referred to as bonding wires) for bonding electrodes on semiconductor elements with wiring such as external leads, fine wires approximately 15 to 50 µm in wire diameter are mainly used. As a method for bonding the bonding wire, a thermosonic bonding process is used commonly together with a general-purpose bonding machine, a capillary jig adapted to connect a bonding wire passed therethrough, and the like. A bonding wire bonding process involves heat-melting a wire tip by arc heat input, forming a ball by surface tension, pressure-bonding (hereinafter referred to as ball bonding) the ball to an electrode of a semiconductor element heated in a range of 150 to 300° C., then forming a loop, and pressure-bonding (hereinafter referred to as wedge bonding) a wire portion to an electrode on the side of the external lead to complete the process. An electrode structure made up of an alloy film composed principally of Al and formed on an Si substrate or an electrode structure in which the electrode on the side of the external lead is plated with Ag or Pd is often used for the electrode on the semiconductor element to which the bonding wire is bonded.

Excellent ball forming property, ball bondability, wedge bondability, loop forming property, and the like are required of the bonding wire. As a bonding wire material which generally satisfies these performance requirements, Au is used mainly. In late years, against the background of skyrocketing Au prices, intensive development of bonding wires have been going on using comparatively inexpensive materials as substitutes for Au. Development examples include a bonding wire having a structure in which a surface of Cu is coated with Pd. This bonding wire features generally improved performance achieved mainly by inhibiting oxidation of the Cu, and is used in a cutting-edge area of LSI (Large Scale Integration).

In the future development of bonding wires, there is strong demand to accommodate high-density packaging resulting from further performance improvement and downsizing of semiconductor devices. In the high-density packaging, to reduce signal delays among LSI layers, fragile low-k materials are sometimes used as interlayer insulating materials, often posing a problem of damage to semiconductor elements. Because spacing among adjacent electrodes is small, making it necessary to reduce the wire diameter of the bonding wire, high wedge bondability is required of the bonding wire. In order to secure electric conductivity with small wire diameter, it is desirable that specific resistance of the material used for the bonding wire is low. As a bonding wire material in such a high-density area, Au is often used because of softness, high wedge bondability, and comparatively low specific resistance.

Attempts are made to use Ag as a bonding wire material in order to solve the above problem with high-density packaging and provide a bonding wire material less expensive than Au. Ag, whose Young's modulus (about $83 \times 10^9$ $N/m^2$) is approximately equal to the Young's modulus of Au (approximately $80 \times 10^9$ $N/m^2$), and lower than the Young's modulus of Cu (approximately $130 \times 10^9$ $N/m^2$), is expected to cause less damage in ball bonding to fragile semiconductor elements and provide good wedge bondability. The specific resistance of Ag (1.6 µΩ·cm) at around room temperature is lower than the specific resistance of Cu (1.7 µΩ·cm) and specific resistance of Au (2.2 µΩ·cm), and thus it is considered that Ag is suitable as a bonding wire material in high-density packaging from the viewpoint of electric characteristics as well.

However, the bonding wire made of Ag (hereinafter referred to as an Ag bonding wire) has a problem of low bonding reliability and low loop stability in high-density packaging. The bonding reliability evaluation is carried out for the purpose of evaluating the life of bonds in an operating environment of the actual semiconductor device. Generally, high temperature storage testing and high temperature high humidity testing are used for bonding reliability evaluation. The Au bonding wire has a problem of being inferior to a bonding wire made of Au (hereinafter referred to as an Au bonding wire) in the life of ball bonds in high temperature high humidity testing. With high-density packaging, small ball bonding is done, decreasing the area which contributes to bonding, and thus it is increasingly difficult to ensure a long life time.

Regarding the loop stability, a failure called a spring failure poses a problem. The spring failure is a phenomenon in which the loop of bonding wires bends in a bonding step, contacting each other and causing a short circuit. With high-density packaging, because spacing among adjacent bonding wires is small, it is strongly desired to prevent spring failures. Spring failures, which occur in proportion to decreasing wire strength, often poses a problem in high-density packaging, which involves reduced wire diameter.

As a method for solving these problems, a technique is disclosed for creating an alloy by adding various elements to Ag, but balls become harder with increases in the concentration of alloy elements, causing chip damage during ball bonding. These problems are responsible for hindering the spread of Ag bonding wires.

Regarding the development of Ag bonding wires for the purpose of improving bonding reliability, for example, Patent Literature 1 discloses a bonding wire containing one or more of Pt, Pd, Cu, Ru, Os, Rh, and Ir for a total of 0.1 to 10 wt %, where Pt is contained 10 wt % or less, Pd is contained 10 wt % or less, Cu is contained 5 wt % or less, Ru is contained 1 wt % or less, Os is contained 1 wt % or less, Rh is contained 1 wt % or less, and Ir is contained 1 wt % or less, with the balance being attributable to Ag and incidental impurities.

For example, Patent Literature 2 discloses an Ag—Au—Pd ternary alloy bonding wire for semiconductor elements made up of Ag with a purity of 99.99 mass % or above, Au with a purity of 99.999 mass % or above, and Pd with a purity of 99.99 mass % or above, wherein Au is contained 4 to 10 mass %, Pd is contained 2 to 5 mass %, and additional oxidizing non-noble metal elements are contained 15 to 70 mass ppm and the balance is made up of Ag; and the bonding wire is subjected to a thermal annealing process before continuous die drawing, subjected to thermal refining treatment after the continuous die drawing, and used for ball bonding in a nitrogen atmosphere.

Regarding the development of Ag bonding wires for the purpose of improving loop stability, a technique is disclosed for controlling tensile strength and 0.2% proof stress by thermomechanical treatment. For example, Patent Literature 3 discloses a bonding wire whose tensile strength measured in a 523K temperature atmosphere after being heated in the temperature atmosphere for 15 to 25 seconds is higher than 0.2% proof stress measured in a 298K temperature atmosphere.

CITATION LIST

Patent Literature

[Patent Literature 1] Japanese Patent Laid-Open No. 11-288962
[Patent Literature 2] Japanese Patent Laid-Open No. 2012-169374
[Patent Literature 3] Japanese Patent Laid-Open No. 2002-319597

SUMMARY OF INVENTION

Technical Problem

However, the Ag bonding wires disclosed in the patent literatures described above cannot meet the performance requirements of high-density packaging for bonding reliability, spring failure, and chip damage.

Regarding high temperature high humidity testing, a test known as PCT (Pressure Cooker Test) is used commonly, where PCT is conducted under conditions of 121° C. temperature and 100% relative humidity. In late years, as a severer evaluation method, a test known as HAST (Highly Accelerated temperature and humidity Stress Test) has come to be used frequently, where HAST is conducted under conditions of 130° C. temperature and 85% relative humidity. Regarding an operating environment, the semiconductor devices for high-density packaging are required to operate normally in HAST after an elapse of 300 hours or more. With Ag bonding wires, the life of ball bonds poses a problem in HAST. When Ag bonding wires are exposed to a high temperature high humidity environment, separation of ball bonds occurs, resulting in loss of electrical contact and causing failures of semiconductor devices. Also, with high-density packaging, smaller than usual balls are often formed and bonded (hereinafter referred to as small ball bonding) to respond to narrower pitches. When small ball bonding is used, stricter bonding reliability is required of bonding wires because the area which contributes to bonding decreases and the life of bonding tends to become shorter.

Spring failures often pose a problem in the area of high-density packaging, and especially in connecting stacked chips used for memory applications. As a method for connecting stacked chips using a bonding wire, a connection method called reverse bonding is often used, in which bonding positions are reversed from normal bonding. In a bonding process of reverse bonding, a stud bump is formed on an electrode on the chip, then a ball portion is bonded to an electrode on the substrate, and finally the bonding wire is wedge-bonded onto the stud bump. The reverse bonding allows loop height to be kept down and enables stable loop control even when the number of stacked chips increases, resulting in considerably high steps. On the other hand, reverse bonding is prone to spring failures.

Chip damage is a defective condition which occurs especially in a ball bonding step among bonding steps. In the area of high-density packaging, along with reduction in chip thickness and increases in the number of chip layers, low-strength structures are increasingly adopted, resulting in growing demand to limit chip damage. Furthermore, with the small ball bonding which is used in high-density packaging, stresses are concentrated during bonding, making chip damage prone to occur, and thus it is desired to strictly limit chip damage.

When conventionally reported Ag bonding wires were used in relation to these performance requirements, the following problems were found in terms of bonding reliability, spring performance, and chip damage performance. Regarding bonding reliability, ball bonding was carried out on an Al electrode, followed by plastic molding. Then when HAST was conducted, bonding strength of ball bonds fell after an elapse of 150 hours, and consequently a life of 300 hours or more required in high-density packaging was not available. When a bonding interface was observed, void formation was noticed on an interface between the Ag bonding wire and Al electrode. It is presumed that this is because part of Ag—Al intermetallic compound formed on the bonding interface corroded. Regarding spring performance, it was found that when reverse bonding was carried out, the loop was bent due to strength deficiency of the bonding wire, making it difficult to prevent spring failure. Regarding chip damage performance, it was found that when small ball bonding was done, cracks developed in the chip, making the chip unsuitable for practical use.

An object of the present invention is to provide a bonding wire which can solve the problems with the conventional techniques and satisfy bonding reliability, spring performance, and chip damage performance required in high-density packaging.

Solution to Problem

A bonding wire for a semiconductor device according to the present invention contains one or more of In, Ga, and Cd for a total of 0.05 to 5 at %, and a balance being made up of Ag and incidental impurities.

Advantageous Effects of Invention

The present invention can satisfy bonding reliability, spring performance, and chip damage performance required in high-density packaging.

DESCRIPTION OF EMBODIMENTS

By containing one or more of In, Ga, and Cd for a total of 0.05 to 5 at %, with the balance being made up of Ag and incidental impurities, the bonding wire for a semiconductor device according to the present invention can improve bonding reliability required in high-density packaging and prevent spring failure.

Effectiveness of the bonding wire according to the present embodiment in improving bonding reliability will be described. When a wire with a wire diameter of 15 to 25 μm is used, in the case of normal bonding, the bonding is carried out by forming a ball whose ball diameter is 1.7 to 2.0 times the wire diameter. In high-density packaging applications, smaller than usual balls with a diameter 1.5 to 1.6 times the wire diameter are often formed and bonded to respond to narrower pitches. When small ball bonding was done using a conventional Ag bonding wire and high temperature high humidity testing was conducted under conditions of 130° C. temperature and 85% relative humidity, the life of ball bonds was less than 150 hours. When the bonding wire according to the present embodiment was used, an excellent ball bond life of 300 hours or more was achieved. Thus, the bonding wire according to the present embodiment meets requirements of high-density packaging and can be used in high-density packaging. Regarding a bonding condition for ball-bonding semiconductor elements of fragile low-k materials, to mitigate damage to the semiconductor elements, it is necessary to weaken ultrasound compared to a usual condition. When this bonding condition was used, with the conventional Ag bonding wire, it was difficult to obtain sufficient bonding areas and the life of ball bonds was less than 100 hours. On the other hand, when the bonding wire according to the present embodiment was used, a ball bond life of 300 hours or more was achieved, verifying that excellent bonding reliability was able to be achieved. It is considered that this is because In, Ga, and Cd contained in the bonding wire according to the present embodiment inhibited the growth of Ag—Al intermetallic compound which could cause corrosion on the bonding interfaces of ball bonds.

Next, effectiveness of the bonding wire according to the present embodiment in inhibiting spring failures will be described. When reverse bonding was carried out on a device having a structure in which plural semiconductor elements were stacked, using a wire with a wire diameter of 15 to 25 μm, spring failures occurred with the conventional Ag bonding wire. In contrast, the bonding wire according to the present embodiment was able to inhibit spring failures. The effect of the bonding wire according to the present embodiment in inhibiting spring failures was confirmed even with a cutting-edge high-density package. It is considered that the effect of improving spring performance was attributable to improvement in the yield strength of the bonding wire.

Thus, it was shown that the bonding wire according to the present embodiment realizes performance required in high-density packaging and cost reduction at the same time, allowing itself to substitute for an Au bonding wire.

A bonding wire containing one or more of In, Ga, and Cd for a total of exceeding 5 at % is not suitable for practical use because the breaking elongation of the bonding wire decreases, creating a defective condition in which the bonding wire is broken during wedge bonding. That is, to satisfy overall performance required of the bonding wire while improving bonding reliability and preventing spring failures, it is effective that one or more of In, Ga, and Cd contained in the bonding wire are 0.05 to 5 at % in total. Preferably the concentration is 0.1 to 2 at % because then the bonding wire can achieve a life of 500 hours in HAST. This is because if the hardness of the balls is kept within an appropriate range, intermetallic compound is formed uniformly on the ball bonding interfaces, making it possible to mitigate stress concentration due to irregularities which can decrease the life of bonding. Furthermore, more preferably the concentration is 0.5 to 1 at % because then the bonding wire can achieve a life of 1000 hours in HAST. This is because if the hardness of the wire portions is kept within an appropriate range, a shape called a tail is stabilized during wedge bonding, making it possible to reduce shape and size variations when balls are formed and thereby reduce variations in bonding reliability.

An ICP emission spectrophotometer or the like can be used for concentration analysis of elements contained in the bonding wire. If elements such as oxygen and carbon are adsorbed on a surface of the bonding wire, a layer of 2 nm may be removed from the surface by sputtering or the like before taking concentration measurements for analysis. As another method, a method which uses acid wash is also useful. Similar methods are available for use in the concentration analysis of Ni, Cu, Rh, Pd, Pt, and Au or Be, B, P, Ca, Y, La, and Ce described later.

The service life of the bonding wire having the above features can be improved if the bonding wire further contains one or more of Ni, Cu, Rh, Pd, Pt, and Au for a total of 0.01 to 5 at %.

If the bonding wire contains In, Ga, Cd, and elements having a strong combining power therewith are further added in combination, this is effective against time degradation.

Surfaces of conventional bonding wires adsorb sulfur atoms with the passage of time, sometimes resulting in deterioration of performance including ball forming property. To inhibit adsorption of sulfur atoms by the bonding wire surface, a technique which reduces the activity of the bonding wire surface is useful. For example, the Ag atoms on the bonding wire surface can be substituted with an element having a lower adsorption ability for sulfur than Ag. Since In, Ga, and Cd exist on the surfaces of the bonding wires, it is considered that sulfur resistance can be improved more effectively by adding an element having strong combining power for these elements.

After conducting active studies, the present inventors have found that if one or more of Ni, Cu, Rh, Pd, Pt, and Au are contained for a total of 0.01 to 5 at %, the bonding wire according to the present embodiment can improve sulfur resistance as well as the service life of the bonding wire. When the concentration is less than 0.01 at %, the above effect cannot be expected. When the concentration exceeds 5 at %, heat input to wire surfaces resulting from arc discharges becomes unstable, making balls with high sphericity unavailable and thereby making the bonding wire unsuitable for practical use.

Preferably the concentration is 0.5 to 3 at %, which will provide a higher effect. This is because variations in heat input from arc discharges can be reduced further.

If one or more of Be, B, P, Ca, Y, La, and Ce are further contained for a total of 10 to 300 at ppm, the bonding wire according to the present embodiment can correct collapsed shape during ball bonding.

The conventional Ag bonding wire, which preferentially deforms balls in an application direction of ultrasound during ball bonding, may sometimes contact an adjacent electrode, causing a short circuit. Therefore, it is necessary to reduce anisotropy of ball deformation and maintain collapsed shape close to a perfect circle during ball bonding. The anisotropy of ball deformation tends to increase with increases in grain size, and thus a technique which refines crystal grains of ball portions is useful.

After conducting active studies, the present inventors have found that if one or more of Be, B, P, Ca, Y, La, and Ce are contained for a total of 10 to 300 at ppm, the bonding wire according to the present embodiment can refine ball grains and correct collapsed shape during ball bonding. When the concentration is less than 10 at ppm, the above effect cannot be expected. When the concentration exceeds 300 at ppm, the breaking elongation of the bonding wire decreases, and the bonding wire is broken during wedge bonding, making the bonding wire unsuitable for practical use. Preferably, the concentration is 20 to 200 at ppm, which will provide a higher effect. This is because this concentration range can reduce an imbalance of elements in balls, causing the elements to get distributed more uniformly.

The bonding wire according to the present embodiment can improve wedge bondability if a total atomic percent concentration of In, Ga, and Cd in a bonding wire surface portion is equal to or larger than twice the total atomic percent concentration in a bonding wire inner portion.

For concentration analysis of a bonding wire in a depth direction from the surface, an Auger electron spectroscope can be used. First, concentration measurements are taken by shaving the surface of the bonding wire by sputtering or the like and concentration profiles in the depth direction are acquired. The elements whose concentration profiles are acquired are Ag, In, Ga, Cd, and O. Along the depth direction from the wire surface, a layer extending from a depth of 0 to 10 nm and a layer extending from a depth of 20 to 30 nm are separated out, an average concentration in each layer is found, and the concentration of each element in each layer is determined.

With wedge bonding, in which bonding wire is deformed to secure a bonding area, the softer the surface portion of the bonding wire, the easier it is to secure the bonding area, providing a higher bonding strength. Thus, a technique is useful which concentrates elements softer than Ag in the surface portion of the bonding wire rather than in inner part of the bonding wire. The inner part of the bonding wire is defined to be a layer extending in the depth direction of 20 to 30 nm from the wire surface while the surface portion of the bonding wire is defined to be a layer extending in the depth direction of 0 to 10 nm from the wire surface.

After conducting active studies, the present inventors have found that when the total atomic percentage of In, Ga, and Cd in the bonding wire surface portion is equal to or larger than twice the total atomic percentage in a bonding wire inner portion, a high bonding strength is obtained in a wedge bond. That is, if $X_{0-10\ nm}$ denotes an average concentration of at least one or more elements selected from the group consisting of In, Ga, and Cd relative to the total of metallic elements in the layer extending in the depth direction of 0 to 10 nm from the wire surface and $X_{20-30\ nm}$ denotes the average concentration in the layer extending in the depth direction of 20 to 30 nm, the bonding wire provides a high bonding strength in the wedge bond when $X_{0-10\ nm}/X_{20-30\ nm} \geq 2$ holds. If $X_{0-10\ nm}/X_{20-30\ nm} < 2$, the above effect cannot be expected.

If an average grain size in a section perpendicular to a wire axis is 0.2 to 3.5 µm, the bonding wire according to the present embodiment can improve feedability of the wire. The wire axis here is an axis passing through a center of the bonding wire and parallel to a longitudinal direction.

Available methods for exposing the wire section include, for example, mechanical polishing and an ion etching process. As a method for determining the average grain size, for example, electron backscattered diffraction (EBSD) can be used. The EBSD method can determine a grain boundary by finding a crystal misorientation between adjacent measuring points. A grain boundary with a misorientation of 15 degrees or more was defined as a high angle grain boundary and a region surrounded by a high angle grain boundary was defined as one crystal grain. The grain size was calculated as a diameter, assuming that the area calculated using dedicated analysis software belonged to a circle.

When the bonding wire is used for bonding, the bonding wire wound around a cylindrical jig called a spool is fed bit by bit. During feeding, because the bonding wire is tensioned in a direction parallel to the wire axis, there is fear that the bonding wire may get deformed, resulting in a reduced wire diameter. To prevent this phenomenon, it is necessary to control strength against shearing stress acting in a direction perpendicular to the wire axis. As a method for controlling the strength against the shearing stress, it is useful to reduce the grain size in a section perpendicular to the wire axis.

After conducting active studies, the present inventors have found that high feeding performance can be obtained if the average grain size in a section perpendicular to the wire axis of the bonding wire is 0.2 to 3.5 µm. More preferably, the average grain size is 0.4 to 3.0 µm, which will provide a higher effect. When the average grain size exceeds 3.5 µm, the above effect is not available because the wire is locally deformed by tensile stress. When the average grain size is less than 0.2 µm, the bonding wire is hardened more than necessary, intensifying wear in a contact with the capillary, and thus is unsuitable for practical use.

In measurement results obtained by measuring crystal directions in a section of the bonding wire, if an abundance ratio of a crystal direction <100> having an angular difference of 15 degrees or less from the longitudinal direction of the bonding wire is between 30% and 100% (both inclusive) in terms of an area percentage, the bonding wire according to the present embodiment can further improve the wedge bondability.

Regarding wedge bondability, by increasing the abundance ratio of the crystal direction <100> having an angular difference of 15 degrees or less from the longitudinal direction of the bonding wire in a section of the bonding wire, deformation of the bond can be enhanced, making it possible to obtain high bonding strength. To obtain the above effect, it is effective that the area of the region having the crystal direction <100> with an angular difference of 15 degrees or less from the longitudinal direction of the wire occupies 30% or more of the total area of the measurement region of crystal direction. When the abundance ratio is less than 30%, the deformation of the bond becomes insufficient, making it impossible to obtain a high bonding strength in the wedge bond.

Available methods for exposing a section of the bonding wire include mechanical polishing and an ion etching process. The crystal directions in the section of the bonding wire can be determined using the EBSD method. The abundance ratio of the crystal direction <100> with an angular difference of 15 degrees or less from the longitudinal direction of the bonding wire can be found by calculating the ratio of the area occupied by the region having the crystal direction <100> to the area of the measurement region of crystal directions determined by EBSD or the like. The measurement region is a section which contains the wire axis and is parallel to the wire axis, measuring 100 µm or less in the longitudinal direction of the wire and extending the entire width of the wire (length substantially equal to the wire diameter).

After conducting active studies, the present inventors have found that if an average total atomic percentage of at least one or more elements selected from the group consisting of In, Ga, and Cd relative to the total of metallic elements in a layer extending in the depth direction of 0 to 1 nm from the outermost surface of the bonding wire according to the present embodiment is kept equal to or larger than 1.2 times the average total atomic percentage in a layer extending in the depth direction of 1 to 10 nm from the outermost surface of the bonding wire, the service life of the capillary can be improved.

There is a problem in that inner part of the capillary is worn by friction with the bonding wire during feeding of the wire. To deal with the above problem, if the strength of the outermost surface of the bonding wire is reduced by controlling the composition of the outermost surface of the bonding wire to reduce the friction between the capillary and the bonding wire, the service life of the capillary can be improved. That is, if $X_{0-1\ nm}$ denotes an average concentration of at least one or more elements selected from the group consisting of In, Ga, and Cd relative to the total of metallic elements in the layer extending in the depth direction of 0 to 1 nm from the wire surface and $X_{1-10\ nm}$ denotes the average concentration in the layer extending in the depth direction of 1 to 10 nm, the bonding wire provides an excellent service life of the capillary when $X_{0-1\ nm}/X_{1-10\ nm} \geq 1.2$ holds. If $X_{0-1\ nm}/X_{1-10\ nm} < 1.2$, the above effect cannot be expected.

Examples

Examples will be described in detail below. The Ag used as a raw material had a purity of 99.9 at % or above and the balance was made up of incidental impurities. The In, Ga, Cd, Ni, Cu, Rh, Pd, Pt, Au, Be, B, P, Ca, Y, La, and Ce used had a purity of 99.9 at % or above with the balance being made up of incidental impurities.

The Ag alloy used for the bonding wire was produced as follows: materials were charged into a cylindrically-shaped carbon crucible with a diameter of 3 to 6 mm, melted by heating to 1080 to 1600° C. in vacuum or in an inert atmosphere of $N_2$, Ar, or another gas using a high-frequency furnace, and then furnace-cooled or air-cooled.

The resulting Ag alloy was processed to a diameter of 0.9 to 1.2 mm by a drawing process and then a wire with a diameter of 300 to 600 μm was produced by a continuous wire drawing process and the like using a die. In so doing, if oxygen or sulfur is adsorbed in the wire surface, an acid wash process may be performed using hydrochloric acid or the like. Subsequently, by repeating intermediate heat treatment at 200 to 500° C. and a wire drawing process, the wire was processed to a final wire diameter of 15 to 25 μm. A commercially available lubricant was used for wire drawing, and the wire feed speed during the wire drawing was 20 to 300 m/min. The intermediate heat treatment was carried out in an Ar gas atmosphere while sweeping the wire continuously. The feed speed of the wire in the intermediate heat treatment was 20 to 200 m/min. If the intermediate heat treatment at 200 to 500° C. is carried out three times or more, the concentration of one or more of In, Ga, and Cd in the layer extending in the depth direction of 0 to 10 nm can be kept higher than the concentration in a layer extending in the depth direction of 20 to 30 nm from the wire surface. Preferably, the intermediate heat treatment temperature is in a range of 200 to 330° C. in the first time, in a range of 250 to 400° C. in the second time, and in a range of 350° C. to 500° C. in the third time and later, which will provide higher efficiency. This is due to an effect whereby an element added by the heat treatment scatters in the surface of the bonding wire. Also, if the wire diameter subjected to the intermediate heat treatment is 50 to 100 μm or above, the average grain size in a section in a direction perpendicular to the wire axis can be kept to 0.2 to 3.5 μm. This is due to the effect of being able to control grain growth during recrystallization. Furthermore, if the wire feed speed during wire drawing is set at 200 to 300 m/min and the intermediate heat treatment temperature is set at 200 to 300° C., the abundance ratio of the crystal direction <100> with an angular difference of 15 degrees or less from the longitudinal direction of the bonding wire can be increased to 30% or above. Note that this technique is also useful when the intermediate heat treatment is carried out multiple times.

Final heat treatment was carried out such that the breaking elongation of the wire after the wire drawing process would eventually be approximately 9 to 15%. The final heat treatment was carried out using a method similar to the one used for the intermediate heat treatment. The wire feed speed during the final heat treatment was 20 to 200 m/min as with the intermediate heat treatment. The final heat treatment temperature was 200 to 600° C. and the heat treatment time was 0.2 to 1.0 seconds. Here, if an additional heating process is carried out after the final heat treatment at 350 to 500° C. for 0.2 to 0.5 seconds, the concentration of one or more of In, Ga, and Cd in the layer extending in the depth direction of 0 to 10 nm from the wire surface can be kept equal to or larger than 1.2 times the concentration in the layer extending in the depth direction of 1 to 10 nm.

Samples for evaluation of bonding reliability were created as follows: electrodes were created by forming a 1.0-μm-thick Al film on an Si substrate on a typical metal frame, ball-bonded using a commercially available wire bonder, and sealed by a commercially available epoxy resin. The balls were formed by running $N_2$+5% $H_2$ gas at a flow rate of 0.4 to 0.6 L/min, and the ball diameter was in a range of 1.5 to 1.6 times the wire diameter. The bonding reliability in a high temperature high humidity environment was determined using an unsaturated pressure cooker tester from the bond life of a ball bond exposed to a high temperature high humidity environment at a temperature of 130° C. and relative humidity of 85%. By conducting a shear test of the ball bond every 100 hours, the bond life of the ball bond was defined as the time at which the value of the shear strength became ⅓ the shear strength obtained initially. Before conducting the shear test after the high temperature high humidity test, the ball bond was exposed by removing resin by acid treatment. As a shear tester, a bond tester made by DAGE Co., Ltd. was used. As the value of shear strength, an average value of measured values of ball bonds at ten locations selected at random was used. In the above evaluation, when the bond life was shorter than 300 hours, a triangle mark was given by judging that there was a problem in practical use, when the bond life was equal to or longer than 300 hours and shorter than 500 hours, a single circle mark was given by judging that there was no problem in practical use, when the bond life was equal to or longer than 500 hours, a double circle mark was given by judging that this was a very good result, and when the bond life was equal to or longer than 1000 hours, a star mark was given.

Samples for evaluation of spring performance were created by carrying out reverse bonding using a commercially available wire bonder on stud bumps formed on electrodes on semiconductor elements, where the reverse bonding is a bonding method which carries out wedge bonding. Regarding bonding conditions, the loop length was 3.0 mm and loop height was 0.13 mm. Loop portions of 200 bonding wires after bonding were observed under an optical microscope and any point where adjacent bonding wires were in contact with each other was judged to be defective. When there were five or more defects, a triangle mark was given by judging that there was a problem in practical use, when there were one to four defects, a single circle mark was given by judging that there was no problem in practical use, and when there was no defect, a double circle mark was given by judging that this was a very good result.

Chip damage performance was evaluated as follows: electrodes were created by forming a 1.0-μm-thick Al film on an Si substrate and ball-bonded using a commercially available wire bonder, and the Si substrate right under the ball bonds was observed under an optical microscope. Any spot on the Si substrate at which cracks were found was judged to be defective. One hundred spots were observed, and when there were one or more defects, a triangle mark was given by judging that there was a problem in practical use, and when there was no defect, a single circle mark was given by judging that this was a very good result.

The service life of the bonding wire was evaluated as follows: bonding was carried out after the bonding wire was left to stand in a standard air atmosphere for a predetermined period of time, and then evaluations were made as to whether good balls were formed and whether ball bonds and wedge bonds were in good bonding state. One hundred balls were observed under an optical microscope, and when there were five or more balls with low sphericity or surface irregularities, the ball formation was judged to be defective. Regarding ball formation conditions, $N_2+5\%$ $H_2$ gas was used at a flow rate of 0.4 to 0.6 L/min and the diameter of the ball was in a range of 1.5 to 1.6 times the wire diameter. To judge whether the ball bonds and wedge bonds were in good bonding state, bonding was carried out 1000 times continuously using a commercially available wire bonder. The ball bonds and wedge bonds were observed under an optical microscope, and when defects such as separation were found in three or more bonds, the bonding wire was judged to be defective. When any of the above defects occurred during a standing period of shorter than 12 months, a triangle mark was given by judging that there was a problem in practical use, when a defect occurred during a standing period of longer than 12 months and shorter than 18 months, a single circle mark was given by judging that there was no problem in practical use, when a defect occurred during a standing period of longer than 18 months and shorter than 24 months, a double circle mark was given by judging that this was a good result, and when no defect occurred during a standing period of longer than 24 months, a star mark was given by judging that this was a very good result.

Collapsed shapes of balls were evaluated as follows: electrodes were created by forming a 1.0-μm-thick Al film on an Si substrate, ball-bonded using a commercially available wire bonder, and observed from directly above using an optical microscope. Collapsed shapes of balls were judged as follows: a collapsed shape close to a circular shape was judged to be good and a collapsed shape oval or flowery was judged to be defective. One hundred ball bonds were observed under an optical microscope, and when there were five or more defective bonds, a triangle mark was given by judging that there was a problem in practical use, when there were one to four defective bonds, a single circle mark was given by judging that there was no problem in practical use, and when there was no defective bond, a double circle mark was given by judging that this was a very good result.

Wedge bondability was evaluated as follows: wedge bonding was carried out by a commercially available wire bonder using an Ag-plated typical metal frame and wedge bonds were observed. Regarding bonding conditions, commonly used bonding conditions were used. Fifty wedge bonds were observed under an optical microscope, and when there was separation of the bonding wire on five or more bonds, a triangle mark was given by judging that there was a problem in practical use, when there was separation on three to four bonds, a single circle mark was given by judging that there was no problem in practical use, when there was separation on one to two bonds, a double circle mark was given by judging that this was a good result, and when there was no defective bond, a star mark was given by judging that this was a very good result.

Bonding wire feeding performance was evaluated as follows: bonding was carried out under typical bonding conditions, then loop portions of the bonding wires were observed under a scanning microscope, the diameters were measured, and a decrease ratio of the diameter with respect to the bonding wire before the bonding was determined. Any bonding wire with a decrease ratio of 80% or less was judged to be defective. Thirty bonding wires were observed, and when there were five or more defective bonding wires, a triangle mark was given by judging that there was a problem in practical use, when there were three or four defective bonding wires, a single circle mark was given by judging that there was no problem in practical use, when there were one to two defective bonding wires, a double circle mark was given by judging that this was a good result, and when there was no defective bonding wire, a star mark was given by judging that this was a very good result.

The service life of a capillary was evaluated based on the wear amount of the hole at the tip of the capillary by observing the hole at the tip of the capillary before and after use. Typical bonding conditions were used. If there was no wear when the capillary was observed after bonding of the bonding wire was carried out 3000 times, a single circle mark was given by judging that there was no problem in practical use, and if there was no wear when the capillary was observed after bonding was carried out 10000 times, a double circle mark was given by judging that this was a good result.

Table 1-1 to Table 1-10 show examples describing features such as the compositions of the bonding wires according to the present invention as well as describing evaluation results of the respective bonding wires. Table 2-1 and Table 2-2 show comparative examples.

A bonding wire according to claim 1 corresponds to Nos. 1 to 188, which, it was confirmed, satisfied the bonding reliability, spring performance, and chip damage performance required in high-density packaging. In contrast, as shown in Nos. 1 to 7 according to the comparative examples, it was confirmed that when the concentrations of In, Ga, and Cd were out of the range described above, sufficient effects were not available. A bonding wire according to claim 2 corresponds to Nos. 31 to 94, 123 to 127, 131 to 135, 140 to 144, 148 to 152, 156 to 160, 164 to 168, 173 to 177, 180, and 182, which, it was confirmed, were able to improve the service life of the bonding wire. A bonding wire according to claim 3 corresponds to Nos. 95 to 127, 134, 135, 143, 144, 151, 152, 159, 160, 167, 168, 176, and 177, which, it was confirmed, provided excellent collapsed ball shapes. A bonding wire according to claim 4 corresponds to Nos. 1 to 127 and 136 to 180, which, it was confirmed, provided good wedge bondability. A bonding wire according to claim 5 corresponds to Nos. 1 to 135, 137 to 168, and 170 to 188, which, it was confirmed, provided excellent wire feeding performance. A bonding wire according to claim 6 corresponds to Nos. 170 to 188, which, it was confirmed, provided better wedge bondability. A bonding wire according to claim 7 corresponds to Nos. 182 to 188, which, it was confirmed, provided an excellent capillary service life.

TABLE 1-1

| | Features | | | | | | | | | | | | | | | | | |
|---|---|---|---|---|---|---|---|---|---|---|---|---|---|---|---|---|---|---|
| Sample No. | In concentration (at. %) | Ga concentration (at. %) | Cd concentration (at. %) | Ni concentration (at. %) | Cu concentration (at. %) | Rh concentration (at. %) | Pd concentration (at. %) | Pt concentration (at. %) | Au concentration (at. %) | Be concentration (at. ppm) | B concentration (at. ppm) | P concentration (at. ppm) | Ca concentration (at. ppm) | Y concentration (at. ppm) | La concentration (at. ppm) | Ce concentration (at. ppm) | $X_{0\text{-}10\,nm}/X_{20\text{-}30\,nm}$ | Average grain size (µm) | Ratio of direction <100> in longitudinal section (%) |
| 1 | 0.05 | | | | | | | | | | | | | | | | 2 | 0.2 | 20 |
| 2 | 0.1 | | | | | | | | | | | | | | | | 2 | 0.2 | 20 |
| 3 | 0.5 | | | | | | | | | | | | | | | | 2 | 0.2 | 20 |
| 4 | 1 | | | | | | | | | | | | | | | | 2 | 0.2 | 20 |
| 5 | 2 | | | | | | | | | | | | | | | | 2 | 0.2 | 20 |
| 6 | 5 | | | | | | | | | | | | | | | | 2 | 0.2 | 20 |
| 7 | | 0.05 | | | | | | | | | | | | | | | 2 | 0.2 | 20 |
| 8 | | 0.1 | | | | | | | | | | | | | | | 2 | 0.2 | 20 |
| 9 | | 0.5 | | | | | | | | | | | | | | | 2 | 0.2 | 20 |
| 10 | | 1 | | | | | | | | | | | | | | | 2 | 0.2 | 20 |
| 11 | | 2 | | | | | | | | | | | | | | | 2 | 0.2 | 20 |
| 12 | | 5 | | | | | | | | | | | | | | | 2 | 0.2 | 20 |
| 13 | | | 0.05 | | | | | | | | | | | | | | 2 | 0.2 | 20 |
| 14 | | | 0.1 | | | | | | | | | | | | | | 2 | 0.2 | 20 |
| 15 | | | 0.5 | | | | | | | | | | | | | | 2 | 0.2 | 20 |
| 16 | | | 1 | | | | | | | | | | | | | | 2 | 0.2 | 20 |
| 17 | | | 2 | | | | | | | | | | | | | | 2 | 0.2 | 20 |
| 18 | | | 5 | | | | | | | | | | | | | | 2 | 0.2 | 20 |
| 19 | 0.03 | 0.02 | | | | | | | | | | | | | | | 2 | 0.2 | 20 |
| 20 | 0.03 | 0.05 | | | | | | | | | | | | | | | 2 | 0.2 | 20 |
| 21 | | | 0.02 | | | | | | | | | | | | | | 2 | 0.2 | 20 |
| 22 | 0.05 | | 0.05 | | | | | | | | | | | | | | 2 | 0.2 | 20 |
| 23 | 1.5 | 0.5 | | | | | | | | | | | | | | | 2 | 0.2 | 20 |
| 24 | 1.5 | | 0.5 | | | | | | | | | | | | | | 2 | 0.2 | 20 |
| 25 | 3 | 2 | | | | | | | | | | | | | | | 2 | 0.2 | 20 |
| 26 | 4 | | 1 | | | | | | | | | | | | | | 2 | 0.2 | 20 |
| 27 | 0.02 | 0.01 | 0.02 | | | | | | | | | | | | | | 2 | 0.2 | 20 |
| 28 | 0.5 | 0.3 | 0.2 | | | | | | | | | | | | | | 2 | 0.2 | 20 |
| 29 | 1.5 | 0.5 | 0.5 | | | | | | | | | | | | | | 2 | 0.2 | 20 |
| 30 | 1 | 3 | 1 | | | | | | | | | | | | | | 2 | 0.2 | 20 |
| 31 | 0.1 | | | 0.01 | | | | | | | | | | | | | 2 | 0.2 | 20 |
| 32 | 0.1 | | | 0.5 | | | | | | | | | | | | | 2 | 0.2 | 20 |
| 33 | 0.1 | | | 3 | | | | | | | | | | | | | 2 | 0.2 | 20 |
| 34 | 0.1 | | | 5 | | | | | | | | | | | | | 2 | 0.2 | 20 |
| 35 | 2 | | | 0.01 | | | | | | | | | | | | | 2 | 0.2 | 20 |
| 36 | 2 | | | 0.5 | | | | | | | | | | | | | 2 | 0.2 | 20 |

TABLE 1-2

| Sample No. | In concentration (at. %) | Ga concentration (at. %) | Cd concentration (at. %) | Ni concentration (at. %) | Cu concentration (at. %) | Rh concentration (at. %) | Pd concentration (at. %) | Pt concentration (at. %) | Au concentration (at. %) | Be concentration (at. ppm) | B concentration (at. ppm) | P concentration (at. ppm) | Ca concentration (at. ppm) | Y concentration (at. ppm) | La concentration (at. ppm) | Ce concentration (at. ppm) | $X_{0-10\ nm}/X_{20-30\ nm}$ | Average grain size (μm) | Ratio of direction <100> in longitudinal section (%) |
|---|---|---|---|---|---|---|---|---|---|---|---|---|---|---|---|---|---|---|---|
| 37 | 2 | | | 3 | | | | | | | | | | | | | 2 | 0.2 | 20 |
| 38 | 2 | | | 5 | | | | | | | | | | | | | 2 | 0.2 | 20 |
| 39 | 0.1 | | | | 0.01 | | | | | | | | | | | | 2 | 0.2 | 20 |
| 40 | 0.1 | | | | 0.5 | | | | | | | | | | | | 2 | 0.2 | 20 |
| 41 | 0.1 | | | | 3 | | | | | | | | | | | | 2 | 0.2 | 20 |
| 42 | 0.1 | | | | 5 | | | | | | | | | | | | 2 | 0.2 | 20 |
| 43 | 2 | | | | 0.01 | | | | | | | | | | | | 2 | 0.2 | 20 |
| 44 | 2 | | | | 0.5 | | | | | | | | | | | | 2 | 0.2 | 20 |
| 45 | 2 | | | | 3 | | | | | | | | | | | | 2 | 0.2 | 20 |
| 46 | 2 | | | | 5 | | | | | | | | | | | | 2 | 0.2 | 20 |
| 47 | 0.1 | | | | | 0.01 | | | | | | | | | | | 2 | 0.2 | 20 |
| 48 | 0.1 | | | | | 0.5 | | | | | | | | | | | 2 | 0.2 | 20 |
| 49 | 0.1 | | | | | 3 | | | | | | | | | | | 2 | 0.2 | 20 |
| 50 | 0.1 | | | | | 5 | | | | | | | | | | | 2 | 0.2 | 20 |
| 51 | 2 | | | | | 0.01 | | | | | | | | | | | 2 | 0.2 | 20 |
| 52 | 2 | | | | | 0.5 | | | | | | | | | | | 2 | 0.2 | 20 |
| 53 | 2 | | | | | 3 | | | | | | | | | | | 2 | 0.2 | 20 |
| 54 | 2 | | | | | 5 | | | | | | | | | | | 2 | 0.2 | 20 |
| 55 | 0.1 | | | | | | 0.01 | | | | | | | | | | 2 | 0.2 | 20 |
| 56 | 0.1 | | | | | | 0.5 | | | | | | | | | | 2 | 0.2 | 20 |
| 57 | 0.1 | | | | | | 3 | | | | | | | | | | 2 | 0.2 | 20 |
| 58 | 0.1 | | | | | | 5 | | | | | | | | | | 2 | 0.2 | 20 |
| 59 | 2 | | | | | | 0.01 | | | | | | | | | | 2 | 0.2 | 20 |
| 60 | 2 | | | | | | 0.5 | | | | | | | | | | 2 | 0.2 | 20 |
| 61 | 2 | | | | | | 3 | | | | | | | | | | 2 | 0.2 | 20 |
| 62 | 2 | | | | | | 5 | | | | | | | | | | 2 | 0.2 | 20 |
| 63 | 0.1 | | | | | | | 0.01 | | | | | | | | | 2 | 0.2 | 20 |
| 64 | 0.1 | | | | | | | 0.5 | | | | | | | | | 2 | 0.2 | 20 |
| 65 | 0.1 | | | | | | | 3 | | | | | | | | | 2 | 0.2 | 20 |
| 66 | 0.1 | | | | | | | 5 | | | | | | | | | 2 | 0.2 | 20 |
| 67 | 2 | | | | | | | 0.01 | | | | | | | | | 2 | 0.2 | 20 |
| 68 | 2 | | | | | | | 0.5 | | | | | | | | | 2 | 0.2 | 20 |
| 69 | 2 | | | | | | | 3 | | | | | | | | | 2 | 0.2 | 20 |
| 70 | 2 | | | | | | | 5 | | | | | | | | | 2 | 0.2 | 20 |
| 71 | 0.1 | | | | | | | | 0.01 | | | | | | | | 2 | 0.2 | 20 |
| 72 | 0.1 | | | | | | | | 0.5 | | | | | | | | 2 | 0.2 | 20 |

TABLE 1-3

| Sample No. | In (at. %) | Ga (at. %) | Cd (at. %) | Ni (at. %) | Cu (at. %) | Rh (at. %) | Pd (at. %) | Pt (at. %) | Au (at. %) | Be (at. ppm) | B (at. ppm) | P (at. ppm) | Ca (at. ppm) | Y (at. ppm) | La (at. ppm) | Ce (at. ppm) | $X_{0\text{-}10\,nm}/X_{20\text{-}30\,nm}$ | Average grain size (μm) | Ratio of direction <100> in longitudinal section (%) |
|---|---|---|---|---|---|---|---|---|---|---|---|---|---|---|---|---|---|---|---|
| 73 | 0.1 | | | | | | | | 3 | | | | | | | | 2 | 0.2 | 20 |
| 74 | 0.1 | | | | | | | | 5 | | | | | | | | 2 | 0.2 | 20 |
| 75 | 2 | | | | | | | | 0.01 | | | | | | | | 2 | 0.2 | 20 |
| 76 | 2 | | | | | | | | 0.5 | | | | | | | | 2 | 0.2 | 20 |
| 77 | 2 | | | | | | | | 3 | | | | | | | | 2 | 0.2 | 20 |
| 78 | 2 | | | | | | | | 5 | | | | | | | | 2 | 0.2 | 20 |
| 79 | 1.5 | | | 0.1 | | | 0.4 | | | | | | | | | | 2 | 0.2 | 20 |
| 80 | 1.5 | | | 1 | | | 2 | | | | | | | | | | 2 | 0.2 | 20 |
| 81 | 1.5 | | | | | | 0.4 | | 0.1 | | | | | | | | 2 | 0.2 | 20 |
| 82 | 1.5 | | | | | | 2 | | 1 | | | | | | | | 2 | 0.2 | 20 |
| 83 | 1.5 | | | | | 0.1 | 0.4 | | 0.1 | | | | | | | | 2 | 0.2 | 20 |
| 84 | 1.5 | | | | | 0.5 | 2 | | 0.4 | | | | | | | | 2 | 0.2 | 20 |
| 85 | 1.5 | | | | | | 0.4 | 0.05 | 0.1 | | | | | | | | 2 | 0.2 | 20 |
| 86 | 1.5 | | | | | | 2 | 0.05 | 0.5 | | | | | | | | 2 | 0.2 | 20 |
| 87 | 1.5 | 0.5 | | | | | 0.4 | | 0.1 | | | | | | | | 2 | 0.2 | 20 |
| 88 | 1.5 | 2 | | | | | 2 | | 1 | | | | | | | | 2 | 0.2 | 20 |
| 89 | 3 | | 0.5 | | | | 0.4 | | 0.1 | | | | | | | | 2 | 0.2 | 20 |
| 90 | 4 | | 1 | | | | 2 | | 1 | | | | | | | | 2 | 0.2 | 20 |
| 91 | 0.02 | 0.01 | 0.02 | | | | 0.4 | | 0.1 | | | | | | | | 2 | 0.2 | 20 |
| 92 | 0.5 | 0.3 | 0.2 | | | | 2 | | | | | | | | | | 2 | 0.2 | 20 |
| 93 | 1 | 1 | 0.5 | | | | 2 | | 1 | | | | | | | | 2 | 0.2 | 20 |
| 94 | 3 | 1 | 1 | | | | 2 | | 1 | | | | | | | | 2 | 0.2 | 20 |
| 95 | 1.5 | | | | | | | | | 10 | | | | | | | 2 | 0.2 | 20 |
| 96 | 1.5 | | | | | | | | | 20 | | | | | | | 2 | 0.2 | 20 |
| 97 | 1.5 | | | | | | | | | 200 | | | | | | | 2 | 0.2 | 20 |
| 98 | 1.5 | | | | | | | | | 300 | | | | | | | 2 | 0.2 | 20 |
| 99 | 1.5 | | | | | | | | | | 10 | | | | | | 2 | 0.2 | 20 |
| 100 | 1.5 | | | | | | | | | | 20 | | | | | | 2 | 0.2 | 20 |
| 101 | 1.5 | | | | | | | | | | 200 | | | | | | 2 | 0.2 | 20 |
| 102 | 1.5 | | | | | | | | | | 300 | | | | | | 2 | 0.2 | 20 |
| 103 | 1.5 | | | | | | | | | | | 10 | | | | | 2 | 0.2 | 20 |
| 104 | 1.5 | | | | | | | | | | | 20 | | | | | 2 | 0.2 | 20 |
| 105 | 1.5 | | | | | | | | | | | 200 | | | | | 2 | 0.2 | 20 |
| 106 | 1.5 | | | | | | | | | | | 300 | | | | | 2 | 0.2 | 20 |
| 107 | 1.5 | | | | | | | | | | | | 10 | | | | 2 | 0.2 | 20 |
| 108 | 1.5 | | | | | | | | | | | | 20 | | | | 2 | 0.2 | 20 |

TABLE 1-4

| Sample No. | In conc. (at. %) | Ga conc. (at. %) | Cd conc. (at. %) | Ni conc. (at. %) | Cu conc. (at. %) | Rh conc. (at. %) | Pd conc. (at. %) | Pt conc. (at. %) | Au conc. (at. %) | Be conc. (at. ppm) | B conc. (at. ppm) | P conc. (at. ppm) | Ca conc. (at. ppm) | Y conc. (at. ppm) | La conc. (at. ppm) | Ce conc. (at. ppm) | $X_{0\text{-}10\,nm}/X_{20\text{-}30\,nm}$ | Average grain size (μm) | Ratio of direction <100> in longitudinal section (%) |
|---|---|---|---|---|---|---|---|---|---|---|---|---|---|---|---|---|---|---|---|
| 109 | 1.5 | | | | | | | | | | | | 200 | | | | 2 | 0.2 | 20 |
| 110 | 1.5 | | | | | | | | | | | | 300 | | | | 2 | 0.2 | 20 |
| 111 | 1.5 | | | | | | | | | | | | | 10 | | | 2 | 0.2 | 20 |
| 112 | 1.5 | | | | | | | | | | | | | 20 | | | 2 | 0.2 | 20 |
| 113 | 1.5 | | | | | | | | | | | | | 200 | | | 2 | 0.2 | 20 |
| 114 | 1.5 | | | | | | | | | | | | | 300 | | | 2 | 0.2 | 20 |
| 115 | 1.5 | | | | | | | | | | | | | | 10 | | 2 | 0.2 | 20 |
| 116 | 1.5 | | | | | | | | | | | | | | 20 | | 2 | 0.2 | 20 |
| 117 | 1.5 | | | | | | | | | | | | | | 200 | | 2 | 0.2 | 20 |
| 118 | 1.5 | | | | | | | | | | | | | | 300 | | 2 | 0.2 | 20 |
| 119 | 1.5 | | | | | | | | | | | | | | | 10 | 2 | 0.2 | 20 |
| 120 | 1.5 | | | | | | | | | | | | | | | 20 | 2 | 0.2 | 20 |
| 121 | 1.5 | | | | | | | | | | | | | | | 200 | 2 | 0.2 | 20 |
| 122 | 1.5 | | | | | | | | | | | | | | | 300 | 2 | 0.2 | 20 |
| 123 | 1.5 | | | | | | 1 | | | | | | | | | | 2 | 0.2 | 20 |
| 124 | 1.5 | | | | | | 2 | | | | | | | | | | 2 | 0.2 | 20 |
| 125 | 1.5 | | | | | | 0.4 | 0.05 | 0.5 | | | | | | | | 2 | 0.2 | 20 |
| 126 | 1.5 | | | | | | 2 | 0.05 | 0.1 | | | | | | | | 2 | 0.2 | 20 |
| 127 | 1.5 | | | | | | 2 | 0.05 | 0.5 | | | | | | | | 2 | 0.2 | 20 |
| 128 | 1.5 | | | | | | | | | 10 | | | | | | | 2 | 0.2 | 20 |
| 129 | 1.5 | 1.5 | | | | | | | | | | | | | | | 2 | 0.2 | 20 |
| 130 | 1.5 | | 1.5 | | | | | | | | | | | | | | 2 | 0.2 | 20 |
| 131 | 1.5 | | | | | | 1 | | 0.5 | | | | | | | | 2 | 0.2 | 20 |
| 132 | 1.5 | | | | | | 2 | | 0.1 | | | | | | | | 2 | 0.2 | 20 |
| 133 | 1.5 | | | | | | 0.4 | 0.05 | | | | | | | | | 1.5 | 0.2 | 20 |
| 134 | 1.5 | | | | | | 1 | | 0.5 | | | | | | | | 1.5 | 0.2 | 20 |
| 135 | 1.5 | | | | | | 2 | | | | | | | | | | 1.5 | 0.2 | 20 |
| 136 | 1.5 | | | | | | | | | | | | | | | | 1.5 | 0.2 | 20 |
| 137 | 1.5 | | 1.5 | | | | | | | | | | | | | | 1.5 | 0.2 | 20 |
| 138 | 1.5 | 1.5 | | | | | | | | | | | | | | | 1.5 | 0.2 | 20 |
| 139 | 1.5 | | | | | | 1 | | | | | | | | | | 2 | 0.2 | 20 |
| 140 | 1.5 | | | | | | | | | | | | | | | | 2 | 0.1 | 20 |
| 141 | 1.5 | | | | | | | | | | | | | | | | 2 | 0.2 | 20 |
| 142 | 1.5 | | | | | | | | | | | | 30 | | | | 2 | 0.2 | 20 |
| 143 | 1.5 | | | | | | | | | | | | | | | | 2 | 0.2 | 20 |
| 144 | 1.5 | | | | | | | | | | | | 30 | | | | 2 | 0.2 | 20 |

TABLE 1-5

| Sample No. | In concentration (at. %) | Ga concentration (at. %) | Cd concentration (at. %) | Ni concentration (at. %) | Cu concentration (at. %) | Rh concentration (at. %) | Pd concentration (at. %) | Pt concentration (at. %) | Au concentration (at. %) | Be concentration (at. ppm) | B concentration (at. ppm) |
|---|---|---|---|---|---|---|---|---|---|---|---|
| 145 | 1.5 | | | | | | | | | | |
| 146 | | 1.5 | | | | | | | | | |
| 147 | | | 1.5 | | | | | | | | |
| 148 | 1.5 | | | | | | 1 | | | | |
| 149 | 1.5 | | | | | | 2 | | 0.5 | | |
| 150 | 1.5 | | | | | | 0.4 | 0.05 | 0.1 | | |
| 151 | 1.5 | | | | | | 1 | | | | 30 |
| 152 | 1.5 | | | | | | 2 | | 0.5 | | |
| 153 | 1.5 | | | | | | | | | | |
| 154 | | 1.5 | | | | | | | | | |
| 155 | | | 1.5 | | | | | | | | |
| 156 | 1.5 | | | | | | 1 | | | | |
| 157 | 1.5 | | | | | | 2 | | 0.5 | | |
| 158 | 1.5 | | | | | | 0.4 | 0.05 | 0.1 | | |
| 159 | 1.5 | | | | | | 1 | | | | 30 |
| 160 | 1.5 | | | | | | 2 | | 0.5 | | |
| 161 | 1.5 | | | | | | | | | | |
| 162 | | 1.5 | | | | | | | | | |
| 163 | | | 1.5 | | | | | | | | |
| 164 | 1.5 | | | | | | 1 | | | | |
| 165 | 1.5 | | | | | | 2 | | 0.5 | | |
| 166 | 1.5 | | | | | | 0.4 | 0.05 | 0.1 | | |
| 167 | 1.5 | | | | | | 1 | | | | 30 |
| 168 | 1.5 | | | | | | 2 | | 0.5 | | |
| 169 | 1.5 | | | | | | | | | | |
| 170 | 1.5 | | | | | | | | | | |
| 171 | | 1.5 | | | | | | | | | |
| 172 | | | 1.5 | | | | | | | | |
| 173 | 1.5 | | | | | | 1 | | | | |
| 174 | 1.5 | | | | | | 2 | | 0.5 | | |
| 175 | 1.5 | | | | | | 0.4 | 0.05 | 0.1 | | |
| 176 | 1.5 | | | | | | 1 | | | | 30 |
| 177 | 1.5 | | | | | | 2 | | 0.5 | | |
| 178 | 0.1 | | | | | | | | | | |
| 179 | 0.1 | | | | | | | | | | |
| 180 | 0.1 | | | | | | 0.01 | | | | |
| 181 | 0.1 | | | | | | | | | | |
| 182 | 0.1 | | | | | | | | 0.01 | | |
| 183 | 0.5 | | | | | | | | | | |
| 184 | 0.9 | | | | | | | | | | |
| 185 | 0.6 | | | | | | | | | | |
| 186 | 1.0 | | | | | | | | | | |
| 187 | | 0.7 | | | | | | | | | |
| 188 | | | 0.8 | | | | | | | | |

| Sample No. | P concentration (at. ppm) | Ca concentration (at. ppm) | Y concentration (at. ppm) | La concentration (at. ppm) | Ce concentration (at. ppm) | $X_{0\text{-}10\ nm}/X_{20\text{-}30\ nm}$ | Average grain size (μm) | Ratio of direction <100> in longitudinal section (%) | $X_{0\text{-}1\ nm}/X_{1\text{-}10\ nm}$ |
|---|---|---|---|---|---|---|---|---|---|
| 145 | | | | | | 2 | 0.4 | 20 | |
| 146 | | | | | | 2 | 0.4 | 20 | |
| 147 | | | | | | 2 | 0.4 | 20 | |
| 148 | | | | | | 2 | 0.4 | 20 | |
| 149 | | | | | | 2 | 0.4 | 20 | |
| 150 | | | | | | 2 | 0.4 | 20 | |
| 151 | | | | | | 2 | 0.4 | 20 | |
| 152 | | 30 | | | | 2 | 0.4 | 20 | |
| 153 | | | | | | 2 | 0.4 | 20 | |
| 154 | | | | | | 2 | 0.4 | 20 | |
| 155 | | | | | | 2 | 0.4 | 20 | |
| 156 | | | | | | 2 | 0.4 | 20 | |
| 157 | | | | | | 2 | 0.4 | 20 | |
| 158 | | | | | | 2 | 0.4 | 20 | |
| 159 | | | | | | 2 | 0.4 | 20 | |
| 160 | | 30 | | | | 2 | 0.4 | 20 | |
| 161 | | | | | | 2 | 3.4 | 20 | |
| 162 | | | | | | 2 | 3.4 | 20 | |
| 163 | | | | | | 2 | 3.4 | 20 | |

TABLE 1-5-continued

|     |    |   |     |    |     |
|-----|----|---|-----|----|-----|
| 164 |    | 2 | 3.4 | 20 |     |
| 165 |    | 2 | 3.4 | 20 |     |
| 166 |    | 2 | 3.4 | 20 |     |
| 167 |    | 2 | 3.4 | 20 |     |
| 168 | 30 | 2 | 3.4 | 20 |     |
| 169 |    | 2 | 6   | 20 |     |
| 170 |    | 2 | 0.2 | 50 |     |
| 171 |    | 2 | 0.2 | 50 |     |
| 172 |    | 2 | 0.2 | 50 |     |
| 173 |    | 2 | 0.2 | 50 |     |
| 174 |    | 2 | 0.2 | 50 |     |
| 175 |    | 2 | 0.2 | 50 |     |
| 176 |    | 2 | 0.2 | 50 |     |
| 177 | 30 | 2 | 0.2 | 50 |     |
| 178 |    | 2 | 0.2 | 30 | 1.1 |
| 179 |    | 2 | 0.2 | 40 | 1.0 |
| 180 |    | 2 | 0.2 | 33 | 1.0 |
| 181 |    | 1.0 | 0.2 | 35 | 1.1 |
| 182 |    | 1.1 | 0.2 | 35 | 1.3 |
| 183 |    | 1.3 | 0.2 | 35 | 1.2 |
| 184 |    | 1.1 | 0.2 | 41 | 1.3 |
| 185 |    | 1.0 | 0.2 | 32 | 1.5 |
| 186 |    | 1.2 | 0.2 | 34 | 1.7 |
| 187 |    | 1.1 | 0.2 | 32 | 1.5 |
| 188 |    | 1.2 | 0.2 | 32 | 1.6 |

TABLE 1-6

| | Operation and effect | | | | | | |
|---|---|---|---|---|---|---|---|
| Sample No. | Bonding reliability (temperature: 130° C.; relative humidity: 85%) | Spring performance | Chip damage | Service life | Collapsed ball shape | Wedge bondability | Wire feeding performance |
| 1  | ○ | ○ | ○ | ○ | ○ | ◎ | ◎ |
| 2  | ◎ | ◎ | ○ | ○ | ○ | ◎ | ◎ |
| 3  | ☆ | ◎ | ○ | ○ | ○ | ◎ | ◎ |
| 4  | ☆ | ◎ | ○ | ○ | ○ | ◎ | ◎ |
| 5  | ◎ | ◎ | ○ | ○ | ○ | ◎ | ◎ |
| 6  | ○ | ○ | ○ | ○ | ○ | ◎ | ◎ |
| 7  | ○ | ○ | ○ | ○ | ○ | ◎ | ◎ |
| 8  | ◎ | ◎ | ○ | ○ | ○ | ◎ | ◎ |
| 9  | ☆ | ◎ | ○ | ○ | ○ | ◎ | ◎ |
| 10 | ☆ | ◎ | ○ | ○ | ○ | ◎ | ◎ |
| 11 | ◎ | ◎ | ○ | ○ | ○ | ◎ | ◎ |
| 12 | ○ | ○ | ○ | ○ | ○ | ◎ | ◎ |
| 13 | ○ | ○ | ○ | ○ | ○ | ◎ | ◎ |
| 14 | ◎ | ◎ | ○ | ○ | ○ | ◎ | ◎ |
| 15 | ☆ | ◎ | ○ | ○ | ○ | ◎ | ◎ |
| 16 | ☆ | ◎ | ○ | ○ | ○ | ◎ | ◎ |
| 17 | ◎ | ◎ | ○ | ○ | ○ | ◎ | ◎ |
| 18 | ○ | ○ | ○ | ○ | ○ | ◎ | ◎ |
| 19 | ○ | ○ | ○ | ○ | ○ | ◎ | ◎ |
| 20 | ○ | ○ | ○ | ○ | ○ | ◎ | ◎ |
| 21 | ◎ | ◎ | ○ | ○ | ○ | ◎ | ◎ |
| 22 | ◎ | ◎ | ○ | ○ | ○ | ◎ | ◎ |
| 23 | ◎ | ◎ | ○ | ○ | ○ | ◎ | ◎ |
| 24 | ◎ | ◎ | ○ | ○ | ○ | ◎ | ◎ |
| 25 | ○ | ○ | ○ | ○ | ○ | ◎ | ◎ |
| 26 | ○ | ○ | ○ | ○ | ○ | ◎ | ◎ |
| 27 | ○ | ○ | ○ | ○ | ○ | ◎ | ◎ |
| 28 | ☆ | ◎ | ○ | ○ | ○ | ◎ | ◎ |
| 29 | ◎ | ◎ | ○ | ○ | ○ | ◎ | ◎ |
| 30 | ○ | ○ | ○ | ○ | ○ | ◎ | ◎ |
| 31 | ◎ | ◎ | ○ | ◎ | ○ | ◎ | ◎ |
| 32 | ◎ | ◎ | ○ | ☆ | ○ | ◎ | ◎ |
| 33 | ◎ | ◎ | ○ | ☆ | ○ | ◎ | ◎ |
| 34 | ◎ | ◎ | ○ | ◎ | ○ | ◎ | ◎ |
| 35 | ◎ | ◎ | ○ | ◎ | ○ | ◎ | ◎ |
| 36 | ◎ | ◎ | ○ | ☆ | ○ | ◎ | ◎ |

TABLE 1-7

| Sample No. | Bonding reliability (temperature: 130° C.; relative humidity: 85%) | Spring performance | Chip damage | Service life | Collapsed ball shape | Wedge bondability | Wire feeding performance |
|---|---|---|---|---|---|---|---|
| 37 | ◎ | ◎ | ○ | ☆ | ○ | ◎ | ◎ |
| 38 | ◎ | ◎ | ○ | ◎ | ○ | ◎ | ◎ |
| 39 | ◎ | ◎ | ○ | ◎ | ○ | ◎ | ◎ |
| 40 | ◎ | ◎ | ○ | ☆ | ○ | ◎ | ◎ |
| 41 | ◎ | ◎ | ○ | ☆ | ○ | ◎ | ◎ |
| 42 | ◎ | ◎ | ○ | ◎ | ○ | ◎ | ◎ |
| 43 | ◎ | ◎ | ○ | ◎ | ○ | ◎ | ◎ |
| 44 | ◎ | ◎ | ○ | ☆ | ○ | ◎ | ◎ |
| 45 | ◎ | ◎ | ○ | ☆ | ○ | ◎ | ◎ |
| 46 | ◎ | ◎ | ○ | ◎ | ○ | ◎ | ◎ |
| 47 | ◎ | ◎ | ○ | ◎ | ○ | ◎ | ◎ |
| 48 | ◎ | ◎ | ○ | ☆ | ○ | ◎ | ◎ |
| 49 | ◎ | ◎ | ○ | ☆ | ○ | ◎ | ◎ |
| 50 | ◎ | ◎ | ○ | ◎ | ○ | ◎ | ◎ |
| 51 | ◎ | ◎ | ○ | ◎ | ○ | ◎ | ◎ |
| 52 | ◎ | ◎ | ○ | ☆ | ○ | ◎ | ◎ |
| 53 | ◎ | ◎ | ○ | ☆ | ○ | ◎ | ◎ |
| 54 | ◎ | ◎ | ○ | ◎ | ○ | ◎ | ◎ |
| 55 | ◎ | ◎ | ○ | ◎ | ○ | ◎ | ◎ |
| 56 | ◎ | ◎ | ○ | ☆ | ○ | ◎ | ◎ |
| 57 | ◎ | ◎ | ○ | ☆ | ○ | ◎ | ◎ |
| 58 | ◎ | ◎ | ○ | ◎ | ○ | ◎ | ◎ |
| 59 | ◎ | ◎ | ○ | ◎ | ○ | ◎ | ◎ |
| 60 | ◎ | ◎ | ○ | ☆ | ○ | ◎ | ◎ |
| 61 | ◎ | ◎ | ○ | ☆ | ○ | ◎ | ◎ |
| 62 | ◎ | ◎ | ○ | ◎ | ○ | ◎ | ◎ |
| 63 | ◎ | ◎ | ○ | ◎ | ○ | ◎ | ◎ |
| 64 | ◎ | ◎ | ○ | ☆ | ○ | ◎ | ◎ |
| 65 | ◎ | ◎ | ○ | ☆ | ○ | ◎ | ◎ |
| 66 | ◎ | ◎ | ○ | ◎ | ○ | ◎ | ◎ |
| 67 | ◎ | ◎ | ○ | ◎ | ○ | ◎ | ◎ |
| 68 | ◎ | ◎ | ○ | ☆ | ○ | ◎ | ◎ |
| 69 | ◎ | ◎ | ○ | ☆ | ○ | ◎ | ◎ |
| 70 | ◎ | ◎ | ○ | ◎ | ○ | ◎ | ◎ |
| 71 | ◎ | ◎ | ○ | ◎ | ○ | ◎ | ◎ |
| 72 | ◎ | ◎ | ○ | ☆ | ○ | ◎ | ◎ |

TABLE 1-8

| Sample No. | Bonding reliability (temperature: 130° C.; relative humidity: 85%) | Spring performance | Chip damage | Service life | Collapsed ball shape | Wedge bondability | Wire feeding performance |
|---|---|---|---|---|---|---|---|
| 73 | ◎ | ◎ | ○ | ☆ | ○ | ◎ | ◎ |
| 74 | ◎ | ◎ | ○ | ◎ | ○ | ◎ | ◎ |
| 75 | ◎ | ◎ | ○ | ◎ | ○ | ◎ | ◎ |
| 76 | ◎ | ◎ | ○ | ☆ | ○ | ◎ | ◎ |
| 77 | ◎ | ◎ | ○ | ☆ | ○ | ◎ | ◎ |
| 78 | ◎ | ◎ | ○ | ◎ | ○ | ◎ | ◎ |
| 79 | ◎ | ◎ | ○ | ☆ | ○ | ◎ | ◎ |
| 80 | ◎ | ◎ | ○ | ☆ | ○ | ◎ | ◎ |
| 81 | ◎ | ◎ | ○ | ☆ | ○ | ◎ | ◎ |
| 82 | ◎ | ◎ | ○ | ☆ | ○ | ◎ | ◎ |
| 83 | ◎ | ◎ | ○ | ☆ | ○ | ◎ | ◎ |
| 84 | ◎ | ◎ | ○ | ☆ | ○ | ◎ | ◎ |
| 85 | ◎ | ◎ | ○ | ☆ | ○ | ◎ | ◎ |
| 86 | ◎ | ◎ | ○ | ☆ | ○ | ◎ | ◎ |
| 87 | ◎ | ◎ | ○ | ☆ | ○ | ◎ | ◎ |
| 88 | ◎ | ◎ | ○ | ☆ | ○ | ◎ | ◎ |
| 89 | ◎ | ◎ | ○ | ☆ | ○ | ◎ | ◎ |
| 90 | ◎ | ◎ | ○ | ☆ | ○ | ◎ | ◎ |
| 91 | ○ | ◎ | ○ | ☆ | ○ | ◎ | ◎ |
| 92 | ◎ | ◎ | ○ | ☆ | ○ | ◎ | ◎ |
| 93 | ◎ | ◎ | ○ | ☆ | ○ | ◎ | ◎ |
| 94 | ◎ | ◎ | ○ | ☆ | ○ | ◎ | ◎ |
| 95 | ◎ | ◎ | ○ | ○ | ◎ | ◎ | ◎ |
| 96 | ◎ | ◎ | ○ | ○ | ☆ | ◎ | ◎ |
| 97 | ◎ | ◎ | ○ | ○ | ☆ | ◎ | ◎ |

TABLE 1-8-continued

| Sample No. | Bonding reliability (temperature: 130° C.; relative humidity: 85%) | Spring performance | Chip damage | Service life | Collapsed ball shape | Wedge bondability | Wire feeding performance |
|---|---|---|---|---|---|---|---|
| 98  | ◎ | ◎ | ○ | ○ | ◎ | ◎ | ◎ |
| 99  | ◎ | ◎ | ○ | ○ | ◎ | ◎ | ◎ |
| 100 | ◎ | ◎ | ○ | ○ | ☆ | ◎ | ◎ |
| 101 | ◎ | ◎ | ○ | ○ | ☆ | ◎ | ◎ |
| 102 | ◎ | ◎ | ○ | ○ | ◎ | ◎ | ◎ |
| 103 | ◎ | ◎ | ○ | ○ | ◎ | ◎ | ◎ |
| 104 | ◎ | ◎ | ○ | ○ | ☆ | ◎ | ◎ |
| 105 | ◎ | ◎ | ○ | ○ | ☆ | ◎ | ◎ |
| 106 | ◎ | ◎ | ○ | ○ | ◎ | ◎ | ◎ |
| 107 | ◎ | ◎ | ○ | ○ | ◎ | ◎ | ◎ |
| 108 | ◎ | ◎ | ○ | ○ | ☆ | ◎ | ◎ |

TABLE 1-9

| Sample No. | Bonding reliability (temperature: 130° C.; relative humidity: 85%) | Spring performance | Chip damage | Service life | Collapsed ball shape | Wedge bondability | Wire feeding performance |
|---|---|---|---|---|---|---|---|
| 109 | ◎ | ◎ | ○ | ○ | ☆ | ◎ | ◎ |
| 110 | ◎ | ◎ | ○ | ○ | ◎ | ◎ | ◎ |
| 111 | ◎ | ◎ | ○ | ○ | ◎ | ◎ | ◎ |
| 112 | ◎ | ◎ | ○ | ○ | ☆ | ◎ | ◎ |
| 113 | ◎ | ◎ | ○ | ○ | ☆ | ◎ | ◎ |
| 114 | ◎ | ◎ | ○ | ○ | ◎ | ◎ | ◎ |
| 115 | ◎ | ◎ | ○ | ○ | ◎ | ◎ | ◎ |
| 116 | ◎ | ◎ | ○ | ○ | ☆ | ◎ | ◎ |
| 117 | ◎ | ◎ | ○ | ○ | ☆ | ◎ | ◎ |
| 118 | ◎ | ◎ | ○ | ○ | ◎ | ◎ | ◎ |
| 119 | ◎ | ◎ | ○ | ○ | ◎ | ◎ | ◎ |
| 120 | ◎ | ◎ | ○ | ○ | ☆ | ◎ | ◎ |
| 121 | ◎ | ◎ | ○ | ○ | ☆ | ◎ | ◎ |
| 122 | ◎ | ◎ | ○ | ○ | ◎ | ◎ | ◎ |
| 123 | ◎ | ◎ | ○ | ☆ | ☆ | ◎ | ◎ |
| 124 | ◎ | ◎ | ○ | ☆ | ☆ | ◎ | ◎ |
| 125 | ◎ | ◎ | ○ | ☆ | ☆ | ◎ | ◎ |
| 126 | ◎ | ◎ | ○ | ☆ | ☆ | ◎ | ◎ |
| 127 | ◎ | ◎ | ○ | ☆ | ☆ | ◎ | ◎ |
| 128 | ◎ | ◎ | ○ | ○ | ○ | ○ | ◎ |
| 129 | ◎ | ◎ | ○ | ○ | ○ | ○ | ◎ |
| 130 | ◎ | ◎ | ○ | ○ | ○ | ○ | ◎ |
| 131 | ◎ | ◎ | ○ | ☆ | ○ | ○ | ◎ |
| 132 | ◎ | ◎ | ○ | ☆ | ○ | ○ | ◎ |
| 133 | ◎ | ◎ | ○ | ☆ | ○ | ○ | ◎ |
| 134 | ◎ | ◎ | ○ | ☆ | ☆ | ○ | ◎ |
| 135 | ◎ | ◎ | ○ | ☆ | ☆ | ○ | ◎ |
| 136 | ◎ | ◎ | ○ | ○ | ○ | ◎ | ○ |
| 137 | ◎ | ◎ | ○ | ○ | ○ | ◎ | ◎ |
| 138 | ◎ | ◎ | ○ | ○ | ○ | ◎ | ◎ |
| 139 | ◎ | ◎ | ○ | ○ | ○ | ◎ | ◎ |
| 140 | ◎ | ◎ | ○ | ☆ | ○ | ◎ | ◎ |
| 141 | ◎ | ◎ | ○ | ○ | ☆ | ◎ | ◎ |
| 142 | ◎ | ◎ | ○ | ○ | ◎ | ◎ | ◎ |
| 143 | ◎ | ◎ | ○ | ○ | ◎ | ◎ | ◎ |
| 144 | ◎ | ◎ | ○ | ○ | ☆ | ◎ | ◎ |

TABLE 1-10

| | Operation and effect | | | | | | | |
|---|---|---|---|---|---|---|---|---|
| Sample No. | Bonding reliability (temperature: 130° C.; relative humidity: 85%) | Spring performance | Chip damage | Service life | Collapsed ball shape | Wedge bondability | Wire feeding performance | Capillary service life |
| 145 | ◎ | ◎ | ○ | ○ | ○ | ◎ | ☆ | |
| 146 | ◎ | ◎ | ○ | ○ | ○ | ◎ | ☆ | |
| 147 | ◎ | ◎ | ○ | ○ | ○ | ◎ | ☆ | |
| 148 | ◎ | ◎ | ○ | ☆ | ○ | ◎ | ☆ | |
| 149 | ◎ | ◎ | ○ | ☆ | ○ | ◎ | ☆ | |
| 150 | ◎ | ◎ | ○ | ☆ | ○ | ◎ | ☆ | |
| 151 | ◎ | ◎ | ○ | ☆ | ☆ | ◎ | ☆ | |
| 152 | ◎ | ◎ | ○ | ☆ | ☆ | ◎ | ☆ | |
| 153 | ◎ | ◎ | ○ | ○ | ○ | ◎ | ☆ | |
| 154 | ◎ | ◎ | ○ | ○ | ○ | ◎ | ☆ | |
| 155 | ◎ | ◎ | ○ | ○ | ○ | ◎ | ☆ | |
| 156 | ◎ | ◎ | ○ | ☆ | ○ | ◎ | ☆ | |
| 157 | ◎ | ◎ | ○ | ☆ | ○ | ◎ | ☆ | |
| 158 | ◎ | ◎ | ○ | ☆ | ○ | ◎ | ☆ | |
| 159 | ◎ | ◎ | ○ | ☆ | ☆ | ◎ | ☆ | |
| 160 | ◎ | ◎ | ○ | ☆ | ☆ | ◎ | ☆ | |
| 161 | ◎ | ◎ | ○ | ○ | ○ | ◎ | ◎ | |
| 162 | ◎ | ◎ | ○ | ○ | ○ | ◎ | ◎ | |
| 163 | ◎ | ◎ | ○ | ○ | ○ | ◎ | ◎ | |
| 164 | ◎ | ◎ | ○ | ☆ | ○ | ◎ | ◎ | |
| 165 | ◎ | ◎ | ○ | ☆ | ○ | ◎ | ◎ | |
| 166 | ◎ | ◎ | ○ | ☆ | ○ | ◎ | ◎ | |
| 167 | ◎ | ◎ | ○ | ☆ | ☆ | ◎ | ◎ | |
| 168 | ◎ | ◎ | ○ | ☆ | ☆ | ◎ | ◎ | |
| 169 | ◎ | ◎ | ○ | ○ | ○ | ◎ | ○ | |
| 170 | ◎ | ◎ | ○ | ○ | ○ | ☆ | ◎ | |
| 171 | ◎ | ◎ | ○ | ○ | ○ | ☆ | ◎ | |
| 172 | ◎ | ◎ | ○ | ○ | ○ | ☆ | ◎ | |
| 173 | ◎ | ◎ | ○ | ☆ | ○ | ☆ | ◎ | |
| 174 | ◎ | ◎ | ○ | ☆ | ○ | ☆ | ◎ | |
| 175 | ◎ | ◎ | ○ | ☆ | ○ | ☆ | ◎ | |
| 176 | ◎ | ◎ | ○ | ☆ | ☆ | ☆ | ◎ | |
| 177 | ◎ | ◎ | ○ | ☆ | ☆ | ☆ | ◎ | |
| 178 | ◎ | ◎ | ○ | ○ | ○ | ☆ | ◎ | ○ |
| 179 | ○ | ○ | ○ | ○ | ○ | ☆ | ◎ | ○ |
| 180 | ◎ | ◎ | ○ | ○ | ◎ | ☆ | ◎ | ○ |
| 181 | ◎ | ◎ | ○ | ○ | ○ | ◎ | ◎ | ○ |
| 182 | ◎ | ◎ | ○ | ◎ | ○ | ◎ | ◎ | ◎ |
| 183 | ◎ | ◎ | ○ | ○ | ○ | ◎ | ◎ | ◎ |
| 184 | ○ | ○ | ○ | ○ | ○ | ◎ | ◎ | ◎ |
| 185 | ◎ | ◎ | ○ | ○ | ○ | ◎ | ◎ | ◎ |
| 186 | ◎ | ◎ | ○ | ○ | ○ | ◎ | ◎ | ◎ |
| 187 | ◎ | ◎ | ○ | ○ | ○ | ◎ | ◎ | ◎ |
| 188 | ◎ | ◎ | ○ | ○ | ○ | ◎ | ◎ | ◎ |

TABLE 2-1

| | Features | | | | | | | | | |
|---|---|---|---|---|---|---|---|---|---|---|
| Sample No. | In concentration (at %) | Ga concentration (at. %) | Cd concentration (at. %) | Ni concentration (at. %) | Cu concentration (at. %) | Rh concentration (at. %) | Pd concentration (at. %) | Pt concentration (at. %) | Au concentration (at. %) | Be concentration (at. ppm) |
| 1 | 0.01 | | | | | | | | | |
| 2 | 6 | | | | | | | | | |
| 3 | | 0.01 | | | | | | | | |
| 4 | | 6 | | | | | | | | |
| 5 | | | 0.01 | | | | | | | |
| 6 | | | 6 | | | | | | | |
| 7 | 0.01 | | | | | | 4 | | | |

TABLE 2-1-continued

| | Features | | | | | | | | |
|---|---|---|---|---|---|---|---|---|---|
| Sample No. | B concentration (at. ppm) | P concentration (at. ppm) | Ca concentration (at. ppm) | Y concentration (at. ppm) | La concentration (at. ppm) | Ce concentration (at. ppm) | $X_{0\text{-}10\,nm}/X_{20\text{-}30\,nm}$ | Average grain size (µm) | Ratio of direction <100> in longitudinal section (%) |
| 1 | | | | | | | 2 | 0.2 | 20 |
| 2 | | | | | | | 2 | 0.2 | 20 |
| 3 | | | | | | | 2 | 0.2 | 20 |
| 4 | | | | | | | 2 | 0.2 | 20 |
| 5 | | | | | | | 2 | 0.2 | 20 |
| 6 | | | | | | | 2 | 0.2 | 20 |
| 7 | | | | | | | 2 | 0.2 | 20 |

TABLE 2-2

| | Operation and effect | | | | | | |
|---|---|---|---|---|---|---|---|
| Sample No. | Bonding reliability (temperature: 130° C.; relative humidity: 85%) | Spring performance | Chip damage | Service life | Collapsed ball shape | Wedge bondability | Wire feeding performance |
| 1 | Δ | Δ | ○ | ○ | ○ | ⊚ | ⊚ |
| 2 | ⊚ | ○ | Δ | ○ | ○ | ⊚ | ⊚ |
| 3 | Δ | Δ | ○ | ○ | ○ | ⊚ | ⊚ |
| 4 | ⊚ | ○ | Δ | ○ | ○ | ⊚ | ⊚ |
| 5 | Δ | Δ | ○ | ○ | ○ | ⊚ | ⊚ |
| 6 | ⊚ | ○ | Δ | ○ | ○ | ⊚ | ⊚ |
| 7 | ○ | Δ | ○ | ○ | ○ | ⊚ | ⊚ |

The invention claimed is:

1. A bonding wire for a semiconductor device containing one or more of In, Ga, and Cd for a total of 0.05 to 5 at %, and a balance being made up of Ag and incidental impurities,
wherein the bonding wire contains no more than 5 at % of Au.

2. The bonding wire for a semiconductor device according to claim 1, further containing one or more of Ni, Cu, Rh, Pd, and Pt for a total of 0.01 to 5 at %.

3. The bonding wire for a semiconductor device according to claim 2, further containing one or more of Be, B, P, Ca, Y, La, and Ce for a total of 10 to 300 at ppm.

4. The bonding wire for a semiconductor device according to claim 2, wherein a total atomic percentage of In, Ga, and Cd in a layer extending in a depth direction of 0 to 10 nm from a wire surface is equal to or larger than twice the same in a layer extending in the depth direction of 20 to 30 nm from the wire surface.

5. The bonding wire for a semiconductor device according to claim 2, wherein an average grain size in a section in a direction perpendicular to a wire axis is 0.2 to 3.5 µm.

6. The bonding wire for a semiconductor device according to claim 2, wherein in measurement results obtained by measuring crystal directions in a section of the bonding wire, the section containing a wire axis and being parallel to the wire axis, the ratio of a crystal direction <100> having an angular difference of 15 degrees or less from a longitudinal direction of the bonding wire is between 30% and 100%, both inclusive, in terms of an area percentage.

7. The bonding wire for a semiconductor device according to claim 2, wherein an average total atomic percentage of at least one or more elements selected from the group consisting of In, Ga, and Cd relative to a total of metallic elements in a layer extending in a depth direction of 0 to 1 nm from a wire surface is equal to or larger than 1.2 times the average total atomic percentage in a layer extending in a depth direction of 1 to 10 nm from the wire surface.

8. The bonding wire for a semiconductor device according to claim 1, further containing one or more of Be, B, P, Ca, Y, La, and Ce for a total of 10 to 300 at ppm.

9. The bonding wire for a semiconductor device according to claim 8, wherein a total atomic percentage of In, Ga, and Cd in a layer extending in a depth direction of 0 to 10 nm from a wire surface is equal to or larger than twice the same in a layer extending in the depth direction of 20 to 30 nm from the wire surface.

10. The bonding wire for a semiconductor device according to claim 8, wherein an average grain size in a section in a direction perpendicular to a wire axis is 0.2 to 3.5 µm.

11. The bonding wire for a semiconductor device according to claim 8, wherein in measurement results obtained by measuring crystal directions in a section of the bonding wire, the section containing a wire axis and being parallel to the wire axis, the ratio of a crystal direction <100> having an angular difference of 15 degrees or less from a longitudinal direction of the bonding wire is between 30% and 100%, both inclusive, in terms of an area percentage.

12. The bonding wire for a semiconductor device according to claim 8, wherein an average total atomic percentage of at least one or more elements selected from the group consisting of In, Ga, and Cd relative to a total of metallic elements in a layer extending in a depth direction of 0 to 1 nm from a wire surface is equal to or larger than 1.2 times the average total atomic percentage in a layer extending in a depth direction of 1 to 10 nm from the wire surface.

13. The bonding wire for a semiconductor device according to claim 1, wherein a total atomic percentage of In, Ga, and Cd in a layer extending in a depth direction of 0 to 10 nm from a wire surface is equal to or larger than twice the same in a layer extending in depth direction of 20 to 30 nm from the wire surface.

14. The bonding wire for a semiconductor device according to claim 1, wherein an average grain size in a section in a direction perpendicular to a wire axis is 0.2 to 3.5 μm.

15. The bonding wire for a semiconductor device according to claim 1, wherein in measurement results obtained by measuring crystal directions in a section of the bonding wire, the section containing a wire axis and being parallel to the wire axis, the ratio of a crystal direction <100> having an angular difference of 15 degrees or less from a longitudinal direction of the bonding wire is between 30% and 100%, both inclusive, in terms of an area percentage.

16. The bonding wire for a semiconductor device according to claim 1, wherein an average total atomic percentage of at least one or more elements selected from the group consisting of In, Ga, and Cd relative to a total of metallic elements in a layer extending in a depth direction of 0 to 1 nm from a wire surface is equal to or larger than 1.2 times the average total atomic percentage in a layer extending in a depth direction of 1 to 10 nm from the wire surface.

17. The bonding wire for a semiconductor device according to claim 1, wherein the bonding wire does not contain Au.

18. A bonding wire for a semiconductor device containing one or more of In, Ga, and Cd for a total of 0.05 to 5 at %, and a balance consisting essentially of Ag and incidental impurities.

* * * * *